(12) United States Patent
Chung (10) Patent No.: US 9,803,846 B2
(45) Date of Patent: Oct. 31, 2017

(54) CIRCUIT SUBSTRATE FOR CARRYING AT LEAST ONE LIGHT-EMITTING DIODE AND LIGHT-EMITTING STRUCTURE FOR PROVIDING ILLUMINATION

(71) Applicant: PARAGON SEMICONDUCTOR LIGHTING TECHNOLOGY CO., LTD., New Taipei (TW)

(72) Inventor: Chia-Tin Chung, Miaoli County (TW)

(73) Assignee: PARAGON SEMICONDUCTOR LIGHTING TECHNOLOGY CO., LTD., New Taipei (TW)

( * ) Notice: Subject to any disclaimer, the term of this patent is extended or adjusted under 35 U.S.C. 154(b) by 279 days.

(21) Appl. No.: 14/605,388

(22) Filed: Jan. 26, 2015

(65) Prior Publication Data

US 2016/0109071 A1    Apr. 21, 2016

(30) Foreign Application Priority Data

Oct. 15, 2014    (TW) .............................. 103218273 U (51) Int. Cl.
*F21S 4/00* (2016.01)
*F21V 29/50* (2015.01)
*H05K 1/02* (2006.01)

(52) U.S. Cl.
CPC ........... *F21V 29/50* (2015.01); *H05K 1/0207* (2013.01); *H05K 1/0206* (2013.01); *H05K 2201/09027* (2013.01); *H05K 2201/10106* (2013.01)

(58) Field of Classification Search
CPC ...... F21V 29/50; F21V 23/005; F21V 23/004; F21V 23/003; H01L 33/647; H05K 1/0204; H05K 1/0206
(Continued)

(56) References Cited

U.S. PATENT DOCUMENTS

| 2006/0006405 A1* | 1/2006 | Mazzochette | ....... H01L 25/0753 257/99 |
| 2013/0329427 A1* | 12/2013 | Pavao | .................... H05K 1/181 362/244 |

(Continued)

*Primary Examiner* — Anh Mai
*Assistant Examiner* — Matthew Peerce
(74) *Attorney, Agent, or Firm* — Li & Cai Intellectual Property (USA) Office (57) ABSTRACT

A circuit substrate for carrying at least one light-emitting diode and a light-emitting structure for providing illumination are disclosed. The circuit substrate includes an insulation base layer, a conductive heat-dissipating layer, an insulation covering layer, a conductive circuit structure and a conductive through structure. The conductive heat-dissipating layer is disposed on the insulation base layer. The insulation covering layer is disposed on the conductive heat-dissipating layer. The conductive circuit structure includes a first electrode conductive layer and a second electrode conductive layer that are disposed on the insulation covering layer. The conductive through structure passes through the insulation covering layer and is connected between the conductive heat-dissipating layer and one of the first electrode conductive layer and the second electrode conductive layer. One of the first electrode conductive layer and the second electrode conductive layer is electrically connected to the conductive heat-dissipating layer through the conductive body.

12 Claims, 3 Drawing Sheets

(58) Field of Classification Search
USPC .................................................. 362/249.02
See application file for complete search history.

(56) References Cited

U.S. PATENT DOCUMENTS

| | | | |
|---|---|---|---|
| 2014/0061692 A1* | 3/2014 | Preuschl | H05K 1/0206 257/91 |
| 2014/0339566 A1* | 11/2014 | Seo | H01L 33/007 257/76 |
| 2015/0069452 A1* | 3/2015 | Zanotto | H01L 33/005 257/99 |

* cited by examiner

CIRCUIT SUBSTRATE FOR CARRYING AT LEAST ONE LIGHT-EMITTING DIODE AND LIGHT-EMITTING STRUCTURE FOR PROVIDING ILLUMINATION

BACKGROUND OF THE INVENTION

1. Field of the Invention

The instant disclosure relates to a circuit substrate and a light-emitting structure, and more particularly to a circuit substrate for carrying at least one light-emitting diode and a light-emitting structure for providing illumination.

2. Description of Related Art

The invention of the lamp greatly changed the style of building construction and the living style of human beings, allowing people to work during the night. Traditional lighting devices such as lamps that adopt incandescent bulbs, fluorescent bulbs, or power-saving bulbs have been generally well-developed and used intensively indoor illumination. However, compared to the newly developed light-emitting-diode (LED) lamps, these traditional lamps have the disadvantages of quick attenuation, high power consumption, high heat generation, short working life, high fragility, and being not recyclable. Thus, various LED package structures are created to replace the traditional lighting devices.

SUMMARY OF THE INVENTION

One aspect of the instant disclosure relates to a circuit substrate for carrying at least one light-emitting diode and a light-emitting structure for providing illumination.

One of the embodiments of the instant disclosure provides a circuit substrate for carrying at least one light-emitting diode, comprising: an insulation base layer, a conductive heat-dissipating layer, an insulation covering layer, a conductive circuit structure and a conductive through structure. The conductive heat-dissipating layer is disposed on the insulation base layer. The insulation covering layer is disposed on the conductive heat-dissipating layer. The conductive circuit structure includes at least one first electrode conductive layer and at least one second electrode conductive layer, and the at least one first electrode conductive layer and the at least one second electrode conductive layer are disposed on the insulation covering layer and separated from each other. The conductive through structure includes at least one through hole passing through the insulation covering layer and a conductive body for filling the at least one through hole, and both the at least one through hole and the conductive body are connected between the conductive heat-dissipating layer and one of the at least one first electrode conductive layer and the at least one second electrode conductive layer. More precisely, the at least one light-emitting diode is disposed on the conductive circuit structure and electrically connected between the at least one first electrode conductive layer and the at least one second electrode conductive layer. One of the at least one first electrode conductive layer and the at least one second electrode conductive layer is electrically connected to the conductive heat-dissipating layer through the conductive body.

Another one of the embodiments of the instant disclosure provides a circuit substrate for carrying at least one light-emitting diode, comprising: an insulation base layer, a conductive heat-dissipating layer, an insulation covering layer, a conductive circuit structure and a conductive through structure. The conductive heat-dissipating layer is disposed on the insulation base layer. The embedded insulation layer is disposed on the conductive heat-dissipating layer. The embedded conductive layer is disposed on the embedded insulation layer. The insulation covering layer is disposed on the embedded conductive layer. The conductive circuit structure includes at least one first electrode conductive layer and at least one second electrode conductive layer, and the at least one first electrode conductive layer and the at least one second electrode conductive layer are disposed on the insulation covering layer and separated from each other. The conductive through structure includes at least one through hole passing through the insulation covering layer and a conductive body for filling the at least one through hole, and both the at least one through hole and the conductive body are connected between the embedded conductive layer and one of the at least one first electrode conductive layer and the at least one second electrode conductive layer. More precisely, the at least one light-emitting diode is disposed on the conductive circuit structure and electrically connected between the at least one first electrode conductive layer and the at least one second electrode conductive layer. One of the at least one first electrode conductive layer and the at least one second electrode conductive layer is electrically connected to the embedded conductive layer through the conductive body.

Yet another one of the embodiments of the instant disclosure provides a light-emitting structure for providing illumination, comprising: a circuit substrate and a light-emitting unit. The circuit substrate includes an insulation base layer, a conductive heat-dissipating layer, an insulation covering layer, a conductive circuit structure and a conductive through structure. The conductive heat-dissipating layer is disposed on the insulation base layer. The insulation covering layer is disposed on the conductive heat-dissipating layer. The conductive circuit structure includes at least one first electrode conductive layer and at least one second electrode conductive layer, and the at least one first electrode conductive layer and the at least one second electrode conductive layer are disposed on the insulation covering layer and separated from each other. The conductive through structure includes at least one through hole passing through the insulation covering layer and a conductive body for filling the at least one through hole, and both the at least one through hole and the conductive body are connected between the conductive heat-dissipating layer and one of the at least one first electrode conductive layer and the at least one second electrode conductive layer. One of the at least one first electrode conductive layer and the at least one second electrode conductive layer is electrically connected to the conductive heat-dissipating layer through the conductive body. The light-emitting unit includes at least one light-emitting diode disposed on the conductive circuit structure and electrically connected between the at least one first electrode conductive layer and the at least one second electrode conductive layer.

Therefore, one of the at least one first electrode conductive layer and the at least one second electrode conductive layer is electrically connected to the conductive heat-dissipating layer or the embedded conductive layer through the conductive body, so that when the at least one light-emitting diode is electrically connected between the at least one first electrode conductive layer and the at least one second electrode conductive layer, one of the at least one first electrode conductive layer and the at least one second electrode conductive layer can be used as an electrically conductive connection or a ground connection for the at least one light-emitting diode.

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

The embodiments of "a circuit substrate for carrying at least one light-emitting diode and a light-emitting structure for providing illumination" of the instant disclosure are described. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

First Embodiment

Figure 1:
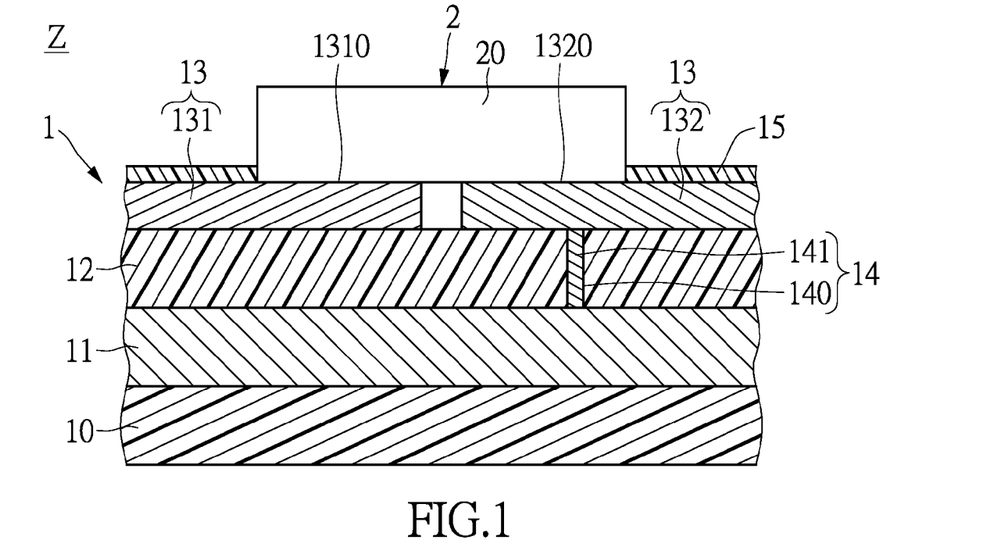
FIG. 1 shows a partial, cross-sectional, schematic view of a circuit substrate for carrying at least one light-emitting diode and a light-emitting structure for providing illumination according to the first embodiment of the instant disclosure.
Figure 2:
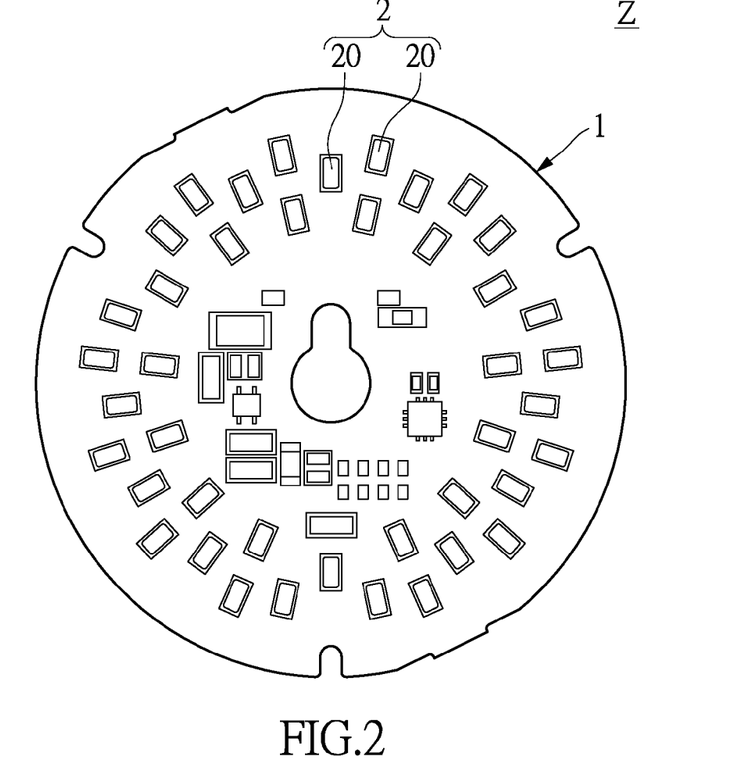
FIG. 2 shows a top, schematic view of a circuit substrate for carrying at least one light-emitting diode and a light-emitting structure for providing illumination according to the first embodiment of the instant disclosure.

Referring to FIG. 1 and FIG. 2, in which FIG. 1 shows a partial, cross-sectional, schematic view of a circuit substrate for carrying at least one light-emitting diode and a light-emitting structure for providing illumination according to the first embodiment of the instant disclosure, and FIG. 2 shows a top, schematic view of a circuit substrate for carrying at least one light-emitting diode and a light-emitting structure for providing illumination according to the first embodiment of the instant disclosure. The first embodiment of the instant disclosure provides a circuit substrate 1 for carrying at least one light-emitting diode 20 (such as a SMD (surface mount device) type LED), comprising: an insulation base layer 10, a conductive heat-dissipating layer 11, an insulation covering layer 12, a conductive circuit structure 13 and a conductive through structure 14.

First, referring to FIG. 1, the conductive heat-dissipating layer 11 is disposed on the insulation base layer 10. The insulation covering layer 12 is disposed on the conductive heat-dissipating layer 11. The conductive circuit structure 13 includes at least one first electrode conductive layer 131 and at least one second electrode conductive layer 132, and the at least one first electrode conductive layer 131 and the at least one second electrode conductive layer 132 are disposed on the insulation covering layer 12 and separated from each other by a predetermined distance, so that the at least one first electrode conductive layer 131 and the at least one second electrode conductive layer 132 are insulated from each other. The conductive through structure 14 includes at least one through hole 140 passing through the insulation covering layer 12 and a conductive body 141 for totally or partially filling the at least one through hole 140 (i.e., the at least one through hole 140 is totally or partially filled with the conductive body 141), and both the at least one through hole 140 and the conductive body 141 are connected between the conductive heat-dissipating layer 11 and one of the at least one first electrode conductive layer 131 and the at least one second electrode conductive layer 132. In addition, one of the at least one first electrode conductive layer 131 and the at least one second electrode conductive layer 132 is electrically connected to the conductive heat-dissipating layer 11 through the conductive body 141.

For example, as shown in FIG. 1, both the at least one through hole 140 and the conductive body 141 are connected between the conductive heat-dissipating layer 11 and the at least one second electrode conductive layer 132, and the at least one second electrode conductive layer 132 is electrically connected to the conductive heat-dissipating layer 11 through the conductive body 141. In addition, the material of the conductive heat-dissipating layer 11 is different from that of the conductive circuit structure 13, for example, the conductive heat-dissipating layer 11 may be an aluminum layer, and both the at least one first electrode conductive layer 131 and the at least one second electrode conductive layer 132 may be copper layers. The insulation base layer 10 may be a silicone layer, and the insulation covering layer 12 may be a prepreg. However, that is merely an example and is not meant to limit the instant disclosure More precisely, as shown in FIG. 1, the circuit substrate 1 further comprises a light-reflecting coating layer 15 (such as a white solder mask or solder resist) disposed on the conductive circuit structure 13. The at least one first electrode conductive layer 131 has a first conductive pad 1310 exposed from the light-reflecting coating layer 15, the at least one second electrode conductive layer 132 has a second conductive pad 1320 exposed from the light-reflecting coating layer 15, and the at least one light-emitting diode 20 is disposed on the conductive circuit structure 13 and is electrically connected between the first conductive pad 1310 of the at least one first electrode conductive layer 131 and the second conductive pad 1320 of the at least one second electrode conductive layer 132. For example, the at least one light-emitting diode 20 has two conductive pins (not shown) corresponding to each other and respectively extended from two opposite sides thereof, and the at least one light-emitting diode 20 can use the two conductive pins (not shown) to electrically connect to the first conductive pad 1310 and the second conductive pad 1320, respectively. Of course, the at least one light-emitting diode 20 also can be placed on the light-reflecting coating layer 15.

Moreover, referring to FIG. 1 and FIG. 2, the first embodiment of the instant disclosure further provides a light-emitting structure Z for providing illumination, comprising a circuit substrate 1 and a light-emitting unit 2. The circuit substrate 1 includes an insulation base layer 10, a conductive heat-dissipating layer 11, an insulation covering layer 12, a conductive circuit structure 13 and a conductive through structure 14, and the light-emitting unit 2 includes at least one light-emitting diode 20 such as a SMD type LED.

First, referring to FIG. 1, the conductive heat-dissipating layer 11 is disposed on the insulation base layer 10. The insulation covering layer 12 is disposed on the conductive heat-dissipating layer 11. The conductive circuit structure 13 includes at least one first electrode conductive layer 131 and at least one second electrode conductive layer 132, and the at least one first electrode conductive layer 131 and the at least one second electrode conductive layer 132 are disposed on the insulation covering layer 12 and separated from each other, so that the at least one first electrode conductive layer 131 and the at least one second electrode conductive layer 132 are insulated from each other. The conductive through structure 14 includes at least one through hole 140 passing through the insulation covering layer 12 and a conductive body 141 for totally or partially filling the at least one through hole 140 (i.e., the at least one through hole 140 is totally or partially filled with the conductive body 141), and both the at least one through hole 140 and the conductive body 141 are connected between the conductive heat-dissipating layer 11 and one of the at least one first electrode conductive layer 131 and the at least one second electrode conductive layer 132.

In addition, as shown in FIG. 1, one of the at least one first electrode conductive layer 131 and the at least one second electrode conductive layer 132 (such as the at least one second electrode conductive layer 132) is electrically connected to the conductive heat-dissipating layer 11 through the conductive body 141, so that when the at least one light-emitting diode 20 is electrically connected between the at least one first electrode conductive layer 131 and the at least one second electrode conductive layer 132, one of the at least one first electrode conductive layer 131 and the at least one second electrode conductive layer 132 (such as the at least one second electrode conductive layer 132) can be used as an electrically conductive connection or a ground connection for the at least one light-emitting diode 20.

Second Embodiment

Figure 3:
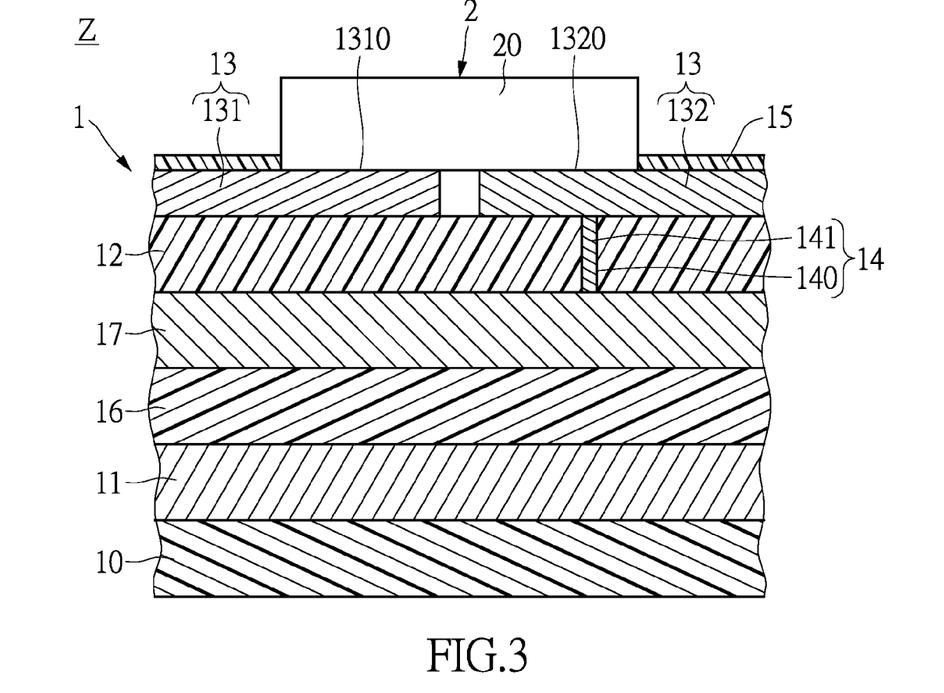
FIG. 3 shows a partial, cross-sectional, schematic view of a circuit substrate for carrying at least one light-emitting diode and a light-emitting structure for providing illumination according to the second embodiment of the instant disclosure.

Referring to FIG. 3, in which FIG. 3 shows a partial, cross-sectional, schematic view of a circuit substrate for carrying at least one light-emitting diode and a light-emitting structure for providing illumination according to the second embodiment of the instant disclosure. The second embodiment of the instant disclosure provides a circuit substrate 1 for carrying at least one light-emitting diode 20 (such as a SMD type LED), comprising: an insulation base layer 10, a conductive heat-dissipating layer 11, an embedded insulation layer 16, an embedded conductive layer 17, an insulation covering layer 12, a conductive circuit structure 13 and a conductive through structure 14.

As shown in FIG. 3, the conductive heat-dissipating layer 11 is disposed on the insulation base layer 10. The embedded insulation layer 16 is disposed on the conductive heat-dissipating layer 11. The embedded conductive layer 17 is disposed on the embedded insulation layer 16. The insulation covering layer 12 is disposed on the embedded conductive layer 17. The conductive circuit structure 13 includes at least one first electrode conductive layer 131 and at least one second electrode conductive layer 132, and the at least one first electrode conductive layer 131 and the at least one second electrode conductive layer 132 are disposed on the insulation covering layer 12 and separated from each other by a predetermined distance, so that the at least one first electrode conductive layer 131 and the at least one second electrode conductive layer 132 are insulated from each other. The conductive through structure 14 includes at least one through hole 140 passing through the insulation covering layer 12 and a conductive body 141 for totally or partially filling the at least one through hole 140 (i.e., the at least one through hole 140 is totally or partially filled with the conductive body 141), and both the at least one through hole 140 and the conductive body 141 are connected between the embedded conductive layer 17 and one of the at least one first electrode conductive layer 131 and the at least one second electrode conductive layer 132. In addition, one of the at least one first electrode conductive layer 131 and the at least one second electrode conductive layer 132 is electrically connected to the embedded conductive layer 17 through the conductive body 141.

For example, as shown in FIG. 3, both the at least one through hole 140 and the conductive body 141 are connected between the embedded conductive layer 17 and the at least one second electrode conductive layer 132, and the at least one second electrode conductive layer 132 is electrically connected to the embedded conductive layer 17 through the conductive body 141. In addition, the material of the conductive heat-dissipating layer 11 is different from that of the embedded conductive layer 17, for example, the conductive heat-dissipating layer 11 may be an aluminum layer and the embedded conductive layer 17 may be a copper layer. The material of the conductive heat-dissipating layer 11 is different from that of the conductive circuit structure 13, for example, the conductive heat-dissipating layer 11 may be an aluminum layer and the conductive circuit structure 13 may be a copper layer. The material of the embedded conductive layer 17 is the same as that of the conductive circuit structure 13, for example, all of the embedded conductive layer 17, the at least one first electrode conductive layer 131, and the at least one second electrode conductive layer 132 are copper layers. The insulation base layer 10 may be a silicone layer, and the insulation covering layer 12 may be a Prepreg. However, that is merely an example and is not meant to limit the instant disclosure.

More precisely, as shown in FIG. 3, the circuit substrate 1 further comprises a light-reflecting coating layer 15 (such as a white solder mask or solder resist) disposed on the conductive circuit structure 13. The at least one first electrode conductive layer 131 has a first conductive pad 1310 exposed from the light-reflecting coating layer 15, the at least one second electrode conductive layer 132 has a second conductive pad 1320 exposed from the light-reflecting coating layer 15, and the at least one light-emitting diode 20 is disposed on the conductive circuit structure 13 and is electrically connected between the first conductive pad 1310 of the at least one first electrode conductive layer 131 and the second conductive pad 1320 of the at least one second electrode conductive layer 132. For example, the at least one light-emitting diode 20 has two conductive pins (not shown) corresponding to each other and respectively extended from two opposite sides thereof, and the at least one light-emitting diode 20 can use the two conductive pins (not shown) to electrically connect to the first conductive pad 1310 and the second conductive pad 1320, respectively. Of course, the at least one light-emitting diode 20 also can be placed on the light-reflecting coating layer 15.

Moreover, referring to FIG. 2 and FIG. 3, the first embodiment of the instant disclosure further provides a light-emitting structure Z for providing illumination, comprising a circuit substrate 1 and a light-emitting unit 2. The circuit substrate 1 includes an insulation base layer 10, a conductive heat-dissipating layer 11, an embedded insulation layer 16, an embedded conductive layer 17, an insulation covering layer 12, a conductive circuit structure 13 and a conductive through structure 14, and the light-emitting unit 2 includes at least one light-emitting diode 20 such as a SMD type LED.

First, as shown in FIG. 3, the conductive heat-dissipating layer 11 is disposed on the insulation base layer 10. The embedded insulation layer 16 is disposed on the conductive heat-dissipating layer 11. The embedded conductive layer 17 is disposed on the embedded insulation layer 16. The insulation covering layer 12 is disposed on the embedded conductive layer 17. The conductive circuit structure 13 includes at least one first electrode conductive layer 131 and at least one second electrode conductive layer 132, and the at least one first electrode conductive layer 131 and the at least one second electrode conductive layer 132 are disposed on the insulation covering layer 12 and separated from each other by a predetermined distance, so that the at least one first electrode conductive layer 131 and the at least one second electrode conductive layer 132 are insulated from each other. The conductive through structure 14 includes at least one through hole 140 passing through the insulation covering layer 12 and a conductive body 141 for totally or partially filling the at least one through hole 140 (i.e., the at least one through hole 140 is totally or partially filled with the conductive body 141), and both the at least one through hole 140 and the conductive body 141 are connected between the embedded conductive layer 17 and one of the at least one first electrode conductive layer 131 and the at least one second electrode conductive layer 132. In addition, one of the at least one first electrode conductive layer 131 and the at least one second electrode conductive layer 132 is electrically connected to the embedded conductive layer 17 through the conductive body 141.

In addition, as shown in FIG. 3, one of the at least one first electrode conductive layer 131 and the at least one second electrode conductive layer 132 (such as the at least one second electrode conductive layer 132) is electrically connected to the embedded conductive layer 17 through the conductive body 141, so that when the at least one light-emitting diode 20 is electrically connected between the at least one first electrode conductive layer 131 and the at least one second electrode conductive layer 132, one of the at least one first electrode conductive layer 131 and the at least one second electrode conductive layer 132 (such as the at least one second electrode conductive layer 132) can be used as an electrically conductive connection or a ground connection for the at least one light-emitting diode 20.

It is worth noting that the insulation base layer 10 can be omitted from the second embodiment to obtain another practicable embodiment.

Figure 4:
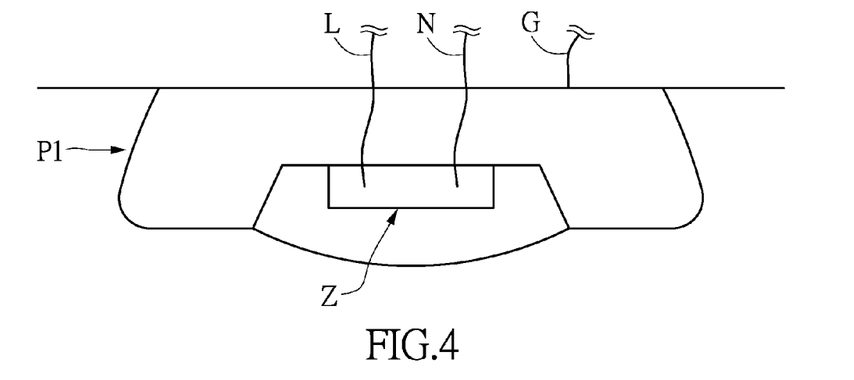
FIG. 4 shows a lateral, schematic view of the light-emitting structures of the first and the second embodiments of the instant disclosure applied to a ceiling light.
Figure 5:
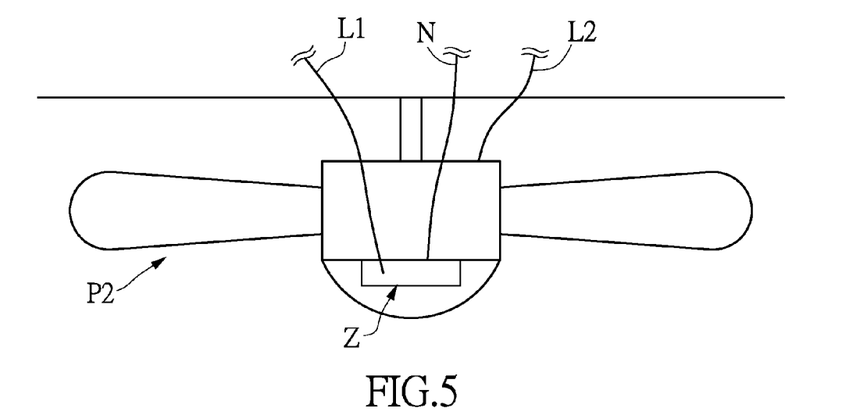
FIG. 5 shows a lateral, schematic view of the light-emitting structures of the first and the second embodiments of the instant disclosure applied to a ceiling fan with light generator.

It is worth mentioning that the light-emitting structure Z of the instant disclosure can be applied to a ceiling light P1 (as shown in FIG. 4) or a ceiling fan with light generator P2 (as shown in FIG. 5), in which the ceiling light P1 can provide a live wire L, a neutral wire N, and an earth wire Q, and the ceiling fan with light generator P2 can provide a first live wire L1 applied to the light-emitting structure Z, a second live wire L2 applied to a fan (not shown), and a neutral wire N concurrently applied to the light-emitting structure Z and the fan. However, the design of the light-emitting structure Z applied to the ceiling light P1 or the ceiling fan with light generator P2 is merely an example and is not meant to limit the instant disclosure.

In conclusion, one of the at least one first electrode conductive layer 131 and the at least one second electrode conductive layer 132 (such as the at least one second electrode conductive layer 132) is electrically connected to the conductive heat-dissipating layer 11 (as shown in the first embodiment) or the embedded conductive layer 17 (as shown in the second embodiment) through the conductive body 141, so that when the at least one light-emitting diode 20 is electrically connected between the at least one first electrode conductive layer 131 and the at least one second electrode conductive layer 132, one of the at least one first electrode conductive layer 131 and the at least one second electrode conductive layer 132 (such as the at least one second electrode conductive layer 132) can be used as an electrically conductive connection or a ground connection for the at least one light-emitting diode 20.

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. A circuit substrate for carrying at least one light-emitting diode, comprising:
   an insulation base layer;
   a conductive heat-dissipating layer disposed on the insulation base layer;
   an insulation covering layer disposed on the conductive heat-dissipating layer;
   a conductive circuit structure including at least one first electrode conductive layer and at least one second electrode conductive layer, wherein the at least one first electrode conductive layer and the at least one second electrode conductive layer are disposed on the insulation covering layer and separated from each other; and
   a conductive through structure including at least one through hole passing through the insulation covering layer and a conductive body for filling the at least one through hole, wherein both the at least one through hole and the conductive body are connected between the conductive heat-dissipating layer and the at least one second electrode conductive layer;
   wherein the at least one light-emitting diode is disposed on the conductive circuit structure and electrically connected between the at least one first electrode conductive layer and the at least one second electrode conductive layer;
   wherein only the at least one second electrode conductive layer is electrically connected to the conductive heat-dissipating layer through the conductive body, and thus the at least one light-emitting diode is electrically grounded through the at least one second electrode conductive layer, the conductive body, and the conductive heat-dissipating layer.

2. The circuit substrate of claim 1, further comprising: a light-reflecting coating layer disposed on the conductive circuit structure, wherein the at least one first electrode conductive layer has a first conductive pad exposed from the light-reflecting coating layer, the at least one second electrode conductive layer has a second conductive pad exposed from the light-reflecting coating layer, and the at least one light-emitting diode is electrically connected between the first conductive pad and the second conductive pad.

3. The circuit substrate of claim 1, wherein the material of the conductive heat-dissipating layer is different from that of the conductive circuit structure, the insulation base layer is a silicone layer, the conductive heat-dissipating layer is an aluminum layer, the insulation covering layer is a prepreg, and both the at least one first electrode conductive layer, and the at least one second electrode conductive layer are copper layers.

4. The circuit substrate of claim 1, wherein the one of the at least one first electrode conductive layer and the at least one second electrode conductive layer that is electrically connected to the conductive heat-dissipating layer through the conductive body is used as an electrically conductive connection or a ground connection for the at least one light-emitting diode.

5. A circuit substrate for carrying at least one light-emitting diode, comprising:
    an insulation base layer;
    a conductive heat-dissipating layer disposed on the insulation base layer;
    an embedded insulation layer disposed on the conductive heat-dissipating layer;
    an embedded conductive layer disposed on the embedded insulation layer;
    an insulation covering layer disposed on the embedded conductive layer;
    a conductive circuit structure including at least one first electrode conductive layer and at least one second electrode conductive layer, wherein the at least one first electrode conductive layer and the at least one second electrode conductive layer are disposed on the insulation covering layer and separated from each other; and
    a conductive through structure including at least one through hole passing through the insulation covering layer and a conductive body for filling the at least one through hole, wherein both the at least one through hole and the conductive body are connected between the embedded conductive layer and the at least one second electrode conductive layer;
    wherein the at least one light-emitting diode is disposed on the conductive circuit structure and electrically connected between the at least one first electrode conductive layer and the at least one second electrode conductive layer;
    wherein only the at least one second electrode conductive layer is electrically connected to the embedded conductive layer through the conductive body, and thus the at least one light-emitting diode is electrically grounded through the at least one second electrode conductive layer, the conductive body, and the conductive heat-dissipating layer.

6. The circuit substrate of claim 5, further comprising: a light-reflecting coating layer disposed on the conductive circuit structure, wherein the at least one first electrode conductive layer has a first conductive pad exposed from the light-reflecting coating layer, the at least one second electrode conductive layer has a second conductive pad exposed from the light-reflecting coating layer, and the at least one light-emitting diode is electrically connected between the first conductive pad and the second conductive pad.

7. The circuit substrate of claim 5, wherein the material of the conductive heat-dissipating layer is different from that of the embedded conductive layer, the material of the conductive heat-dissipating layer is different from that of the conductive circuit structure, and the material of the embedded conductive layer is the same as that of the conductive circuit structure, wherein the insulation base layer is a silicone layer, the conductive heat-dissipating layer is an aluminum layer, the insulation covering layer is a prepreg, and all of the embedded conductive layer, the at least one first electrode conductive layer, and the at least one second electrode conductive layer are copper layers.

8. The circuit substrate of claim 5, wherein the one of the at least one first electrode conductive layer and the at least one second electrode conductive layer that is electrically connected to the conductive heat-dissipating layer through the conductive body is used as an electrically conductive connection or a ground connection for the at least one light-emitting diode.

9. A light-emitting structure for providing illumination, comprising:
    a circuit substrate comprising:
        an insulation base layer;
        a conductive heat-dissipating layer disposed on the insulation base layer;
        an insulation covering layer disposed on the conductive heat-dissipating layer;
        a conductive circuit structure including at least one first electrode conductive layer and at least one second electrode conductive layer, wherein the at least one first electrode conductive layer and the at least one second electrode conductive layer are disposed on the insulation covering layer and separated from each other; and
        a conductive through structure including at least one through hole passing through the insulation covering layer and a conductive body for filling the at least one through hole, wherein both the at least one through hole and the conductive body are connected between the conductive heat-dissipating layer and the at least one second electrode conductive layer, and one of the at least one first electrode conductive layer and the at least one second electrode conductive layer is electrically connected to the conductive heat-dissipating layer through the conductive body; and
    a light-emitting unit including at least one light-emitting diode disposed on the conductive circuit structure and electrically connected between the at least one first electrode conductive layer and the at least one second electrode conductive layer
    wherein only the at least one second electrode conductive layer is electrically connected to the conductive heat-dissipating layer through the conductive body, and thus the at least one light-emitting diode is electrically grounded through the at least one second electrode conductive layer, the conductive body, and the conductive heat-dissipating layer.

10. The light-emitting structure of claim 9, wherein the circuit substrate comprises a light-reflecting coating layer disposed on the conductive circuit structure, wherein the at least one first electrode conductive layer has a first conductive pad exposed from the light-reflecting coating layer, the at least one second electrode conductive layer has a second conductive pad exposed from the light-reflecting coating layer, and the at least one light-emitting diode is electrically connected between the first conductive pad and the second conductive pad.

11. The light-emitting structure of claim 9, wherein the material of the conductive heat-dissipating layer is different from that of the conductive circuit structure, the insulation base layer is a silicone layer, the conductive heat-dissipating layer is an aluminum layer, the insulation covering layer is a prepreg, and both the at least one first electrode conductive layer, and the at least one second electrode conductive layer are copper layers.

12. The light-emitting structure of claim 9, wherein the one of the at least one first electrode conductive layer and the at least one second electrode conductive layer that is electrically connected to the conductive heat-dissipating layer through the conductive body is used as an electrically conductive connection or a ground connection for the at least one light-emitting diode.

\* \* \* \* \*